United States Patent
Shih

(10) Patent No.: US 7,127,269 B2
(45) Date of Patent: Oct. 24, 2006

(54) FRONT-END MODULE FOR MULTI-BAND AND MULTI-MODE WIRELESS NETWORK SYSTEM

(75) Inventor: Cheng-yen Shih, Taoyuan County (TW)

(73) Assignee: Delta Electronics, Inc. (TW)

( * ) Notice: Subject to any disclaimer, the term of this patent is extended or adjusted under 35 U.S.C. 154(b) by 440 days.

(21) Appl. No.: 10/810,138

(22) Filed: Mar. 26, 2004

(65) Prior Publication Data

US 2005/0143023 A1 Jun. 30, 2005

(30) Foreign Application Priority Data

Dec. 30, 2003 (TW) .............................. 92137519 A

(51) Int. Cl.
H04B 1/38 (2006.01)
H04M 1/00 (2006.01)
(52) U.S. Cl. ................. 455/552.1; 455/101; 455/188.1
(58) Field of Classification Search ............. 455/552.1, 455/553.1, 101, 103, 188.1, 272, 292, 132; 257/678, 690
See application file for complete search history.

(56) References Cited

U.S. PATENT DOCUMENTS

| | | | |
|---|---|---|---|
| 5,794,159 A * | 8/1998 | Portin ..................... | 455/553.1 |
| 6,728,517 B1 * | 4/2004 | Sugar et al. .................. | 455/73 |
| 6,990,357 B1 * | 1/2006 | Ella et al. ................. | 455/553.1 |
| 2004/0232982 A1 * | 11/2004 | Ichitsubo et al. ........... | 330/129 |
| 2005/0205986 A1 * | 9/2005 | Ichitsubo et al. ........... | 257/690 |
| 2006/0094393 A1 * | 5/2006 | Okuyama et al. ........... | 455/333 |

* cited by examiner

*Primary Examiner*—Nguyen T. Vo
(74) *Attorney, Agent, or Firm*—Martine Penilla & Gencarella, LLP

(57) ABSTRACT

A front-end module for multi-band and multi-mode wireless network system is disclosed. The front-end module includes a diversity switch, two channel-separating devices, a plurality of band pass filters, a plurality of baluns, and a plurality of low pass filters. The number of the band pass filters, the number of the low pass filters, and the number of the baluns are the same as the number of the channels for carrying a radio frequency signal. In addition, all the band pass filters are connected to one channel-separating device while all the low pass filters are connected to the other one, and the baluns are one-on-one connected to the band pass filters.

21 Claims, 4 Drawing Sheets

US 7,127,269 B2

FRONT-END MODULE FOR MULTI-BAND AND MULTI-MODE WIRELESS NETWORK SYSTEM

BACKGROUND OF THE INVENTION

1. Field of the Invention

The invention relates to a front-end module and, more particularly, to a front-end module for multi-band and multi-mode wireless network system.

2. Description of the Related Art

Up to the present, the technology for wireless network is mainly divided into two categories. One utilizes a radio wave to make a transmission while the other one utilizes light beam such as infrared light and laser to make a transmission.

The technology utilizing a radio wave is developing in two aspects. One is the blue-tooth technology applied in circumstance of short distance (10 meter), low power consuming (100 mW), and low cost while the other one is the IEEE802.11 technology applied in the office (data transmission rate can be increased up to 54 Mbps and the distance can be lengthen to 100 meter around).

The standard specification for the wireless network system has advanced from IEEE802.11 to IEEE802.11b/g/a since 1997, which indicates that the demand for multi-band and multi-mode is increasing. A wireless network system based on the IEEE802.11 technology always includes a front end module, a base-band processor (defined as PHY), and a media access controller (MAC), and the front end module usually includes a great quantity of passive components such as capacitors, inductances, resistors, filters, and impedance converters. However, these components are usually large and cost one a lot of time to assemble them.

Accordingly, the invention proposes a front-end module that satisfies the need for multi-band and multi-mode, modularization, and miniaturization for a wireless network system. The proposed module is capable of solving the problems of low reliability, high cost, and large volume involved in a conventional front-end module.

BRIEF SUMMARY OF THE INVENTION

A front-end module for multi-band and multi-mode wireless network system, which is made with LTCC (Low Temperature Cofired Ceramic) technology, is proposed to satisfy the demand of multi-band and multi-mode and miniaturization for the wireless network system that does not include wireless communication system for mobile phones.

The front-end module for multi-band and multi-mode wireless network system according to an aspect of the invention includes two diplexers each comprising at least a high pass filter and a first low pass filter, a diversity switch, a plurality of band pass filters, a plurality of baluns, and a plurality of second low pass filters.

The number of the band pass filters, baluns, or low pass filters is equivalent to the number of the channels for carrying a radio frequency signal. Besides, the diplexers are used to provide channels for separately carrying the radio frequency signals after these signals are received. The diversity switch connects one of the diplexers with one of the antennas. The band pass filters are connected to one of the diplexers while the low pass filters are connected to the other one of the diplexers. The baluns are one-on-one connected to the band pass filters.

On the other hand, the diplexers, the band pass filters, the baluns, and the low pass filters are formed inside the low temperature co-fired ceramic substrates by patterning, while the diversity switch is disposed on a surface layer of the ceramic substrates by surface mounting technology.

The invention is advantaged in: the broad application due to the multi-band and the multi-mode characteristics; the reduced volume, improved heat dissipation efficiency, lowered cost, and raised reliability; and the reduced manufacturing time and the better compliance of design with manufacture.

DETAILED DESCRIPTION OF THE INVENTION

Hereinafter, the front-end module for multi-band and multi-mode wireless network system and the involved elements according to the invention, and the relationship between these elements and a signal reception and transmission will be illustrated by the following embodiments and accompanied drawings.

Figure 1:
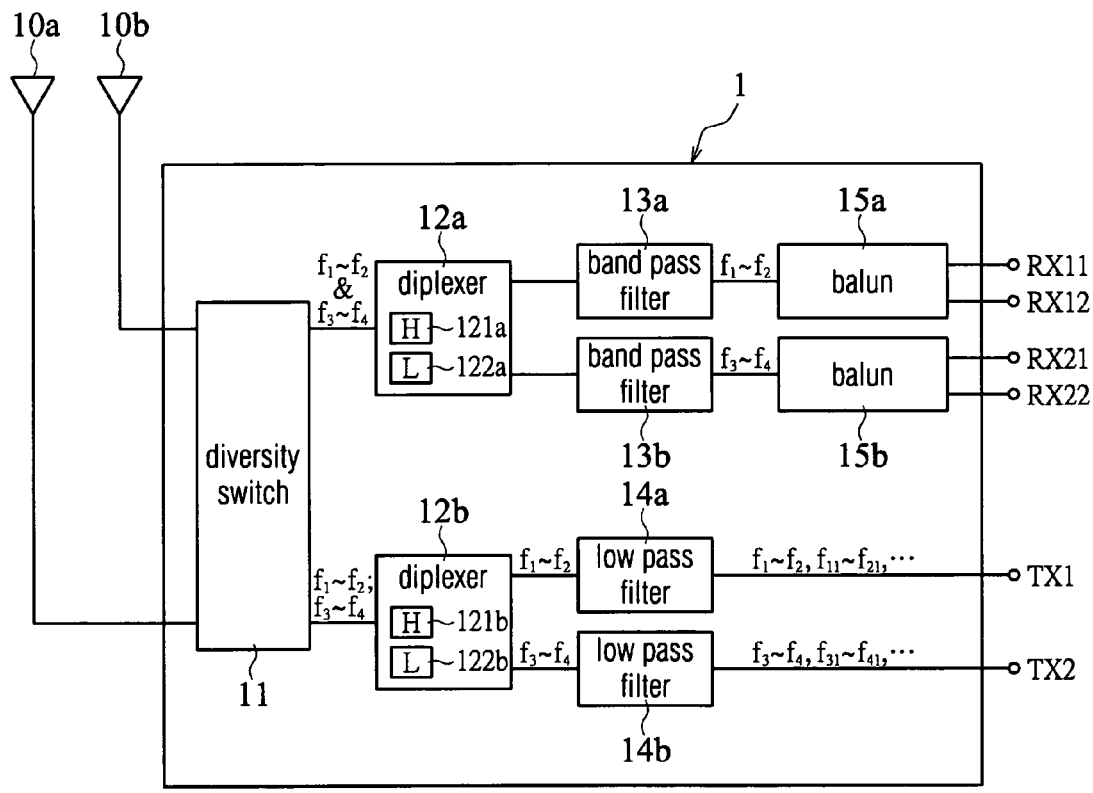
FIG. 1 is a block diagram showing the front-end module for multi-band and multi-mode wireless network system according to the first embodiment of the invention.

Referring to FIG. 1, the front-end module 1 for multi-band and multi-mode wireless network system according to first embodiment of the invention includes a diversity switch 11, two diplexers 12a and 12b, two band pass filters 13a and 13b, two low pass filters 14a and 14b, and two baluns 15a and 15b. The number of the band pass filters, low pass filters, and baluns is respectively the same as the number of the channels for carrying a frequency signal. Moreover, the front of the front-end module 1 connects two external antennas 10a and 10b while the back of the front-end module 1 connects the receiving terminals RX11, RX12, RX21, RX22 and transmitting terminals TX1 and TX2.

The diversity switch 11 connects the diplexer 12a or 12b with an antenna automatically selected from the antennas 10a and 10b by the entire wireless network system according to the signal receiving situation.

The diplexer 12a (or 12b) includes at least a high pass filter 121a (or 121b) and a low pass filter 122a (or 122b) to serve as channel-separating devices. That is, the diplexer 12a has two wireless channels each with frequency band of f1~f2 and f3~f4, such as well known ISM (Industrial, Science, Medical) channels with frequency band of 2.4~2.5 GHz and 5.15~5.85 GHz, for carrying radio frequencies received by the wireless network system in order that the radio frequencies carried on different wireless channels can be separated from each other. For example, the low pass filter 122a allows only signals with frequency equal to and smaller than frequency f2 to pass by, while the high pass filter 121a allows only signals with frequency equal to and larger than frequency f3 to pass by. On the other hand, the diplexer 12b is responsible for the respective transmission of radio frequency signals carried on different channels when the wireless network system is preparing for a signal transmission.

In addition, the back of the diplexer 12a connects the band pass filters 13a and 13b that are respectively responsible for filtering the signals not carried on channels with frequency band of f1~f2 and f3~f4 after the separation of the channels. The band pass filters 13a and 13b and baluns 15a and 15b are one-on-one connected to each other. In this way, the radio frequency signals carried on the channels with frequency band of f1~f2 and f3~f4 can be separately transformed into two radio frequency signals with phase difference of 180 degree and received by the receive terminal RX11, RX12, RX21, and RX22, respectively.

The back of the diplexer 12b is connected to low pass filters 14a and 14b. These low filters 14a and 14b allow only radio frequency signals carried on channels with frequency band of $f_1$~$f_2$ and $f_3$~$f_4$ to pass by and filter the unnecessary signals raised in the wireless network system out when the wireless network system transmits the radio frequency signals to be transmitted to the front-end module 1 via receiving terminals TX1 and TX2. These unnecessary signals raised in the wireless network system include signals with higher frequencies $f_{11}$~$f_{21}$ and $f_{31}$~$f_{41}$ produced in an amplifying process of the transmission signals through a power amplifier, and some noises. Subsequently, the radio frequency signals carried on channels with frequency band of f1~$f_2$ and $f_3$~$f_4$ are transmitted out through the diplexer 12b separately.

Figure 2:
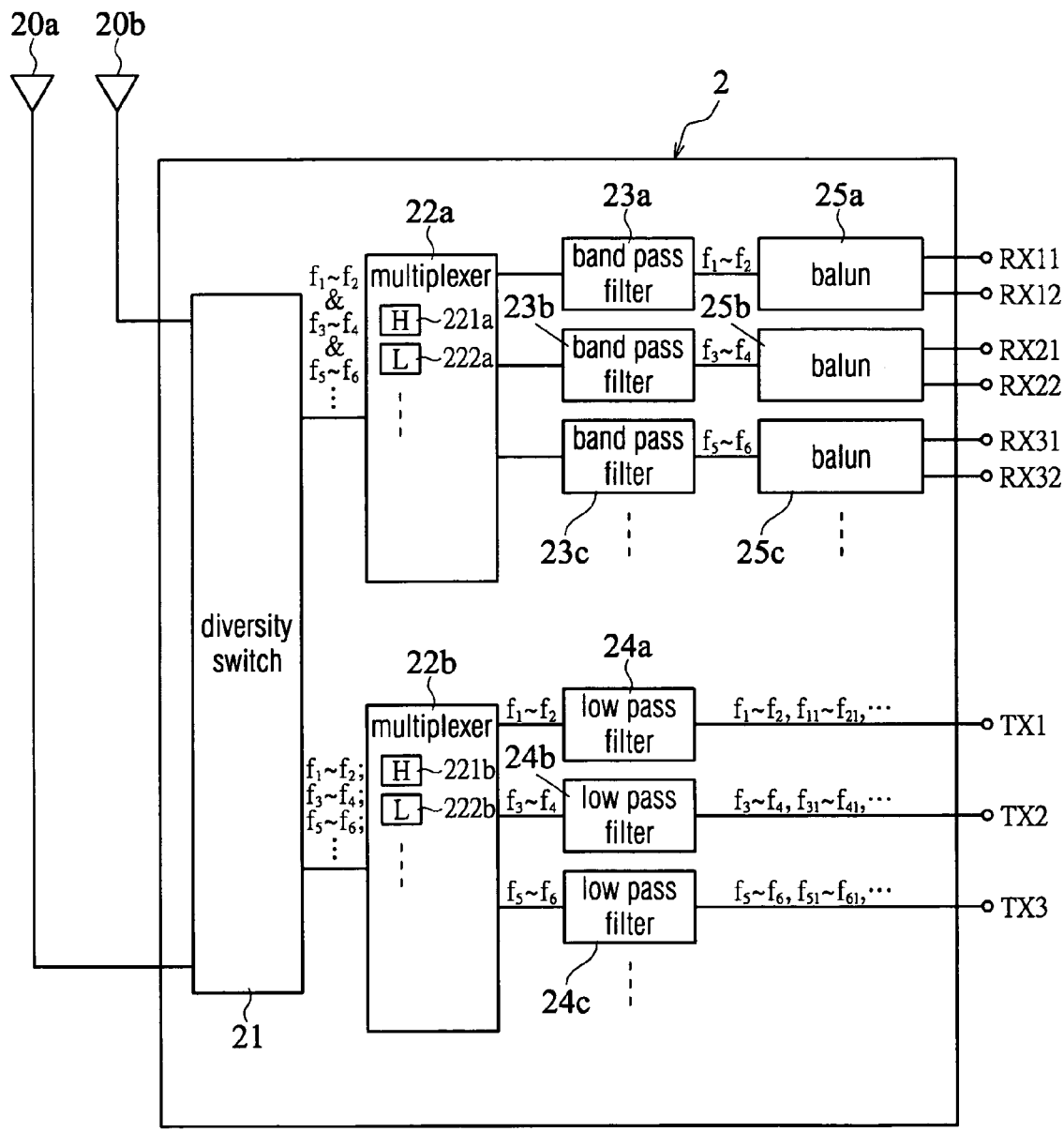
FIG. 2 is a block diagram showing the front-end module for multi-band and multi-mode wireless network system according to the second embodiment of the invention.

Referring to FIG. 2, the front-end module 2 for multi-band and multi-mode wireless network system according to second embodiment of the invention includes at least a diversity switch 21, two multi-plexers 22a and 22b, a plurality of band pass filters 23a, 23b, 23c . . . , a plurality of low pass filters 24a, 24b, 24c . . . , and a plurality of baluns 25a, 25b, 25c . . . . The number of band pass filters, low pass filters, baluns is respectively the same as that of the channels for carrying a frequency signal. Moreover, the front of the front-end module 2 connects two external antennas 20a and 20b while the back of the front-end module 2 connects the receiving terminals RX11, RX12, RX21, RX22, RX31, RX32 . . . and transmitting terminals TX1, TX2, TX3 . . . .

The diversity switch 21 connects the diplexer 22a or 22b with an antenna automatically selected from the antennas 20a and 20b by the entire wireless network system according to the signal receiving situation.

There are at least a high pass filter 221a (or 221b) and a low pass filter 222a (or 222b) and sometimes a band pass filter (not shown) inside the diplexer 22a (or 22b) to serve as channel-separating devices. Specifically, the diplexer 22a has the wireless channels with frequency bands of f1~f2, f3~f4, and f5~f6 . . . for carrying radio frequencies received by the wireless network system in order that the radio frequency signals carried on different wireless channels can be separated from each other. On the other hand, the diplexer 22b is responsible for the respective transmission of the radio frequency signals carried on different channels with frequency band of f1~f2, f3~f4, and f5~f6 . . . when the wireless network system is preparing for a signal transmission.

In addition, the back of the diplexer 22a is connected to the band pass filters 23a, 23b, 23c . . . which are respectively responsible for filtering the signals not carried on channels with frequency bands of f1~f2, f3~f4, f5~f6 . . . after the separation of the channels. The band pass filters 23a, 23b, 23c . . . are one-on-one connected to baluns 25a, 25b, 25c . . . . These baluns are used to separately transformed a radio frequency signal carried on each of the channels with frequency band of f1~f2, f3~f4, f5~f6 . . . into two radio frequency signals with phase difference of 180 degree, which are received by the receive terminal RX11, RX12, RX21, RX22, RX31, RX32 . . . , respectively.

The back of the diplexer 22b is connected to low pass filter 24a, 24b, 24c . . . . These low filters 24a, 24b, 24c . . . allow only radio frequency signals carried on channels with frequency band of f1~f2, f3~f4, f5~f6 . . . to pass by and filter the unnecessary signals raised in the wireless network system out when the wireless network system transmits the radio frequency signals to be transmitted to the front-end module 2 via receiving terminals TX1, TX2, TX3 . . . . These unnecessary signals raised in the wireless network system include signals with high frequency f11~f21, f31~f41, f51~f61 . . . produced in an amplifying process of the transmission signals through a power amplifier, and some noises. Subsequently, the radio frequency signals carried on channels with frequency band f1~f2, f3~f4, f5~f6 . . . are transmitted out through the diplexer 22b separately.

In the above-mentioned embodiments, the diversity switches 11 and 21 each has at least a GaAs switch and several subordinate passive elements such as capacitors with large capacitance and resistors, and the diplexers 12a and 12b, the multi-plexers 22a and 22b, the band pass filters 13a, 13b, 23a, 23b, 23c . . . , the baluns 15a, 15b, 25a, 25b, 25c . . . , and the low pass filters 14a, 14b, 24a, 24b, 24c . . . each has a LC circuit consisting of capacitors and inductances.

Figure 3:
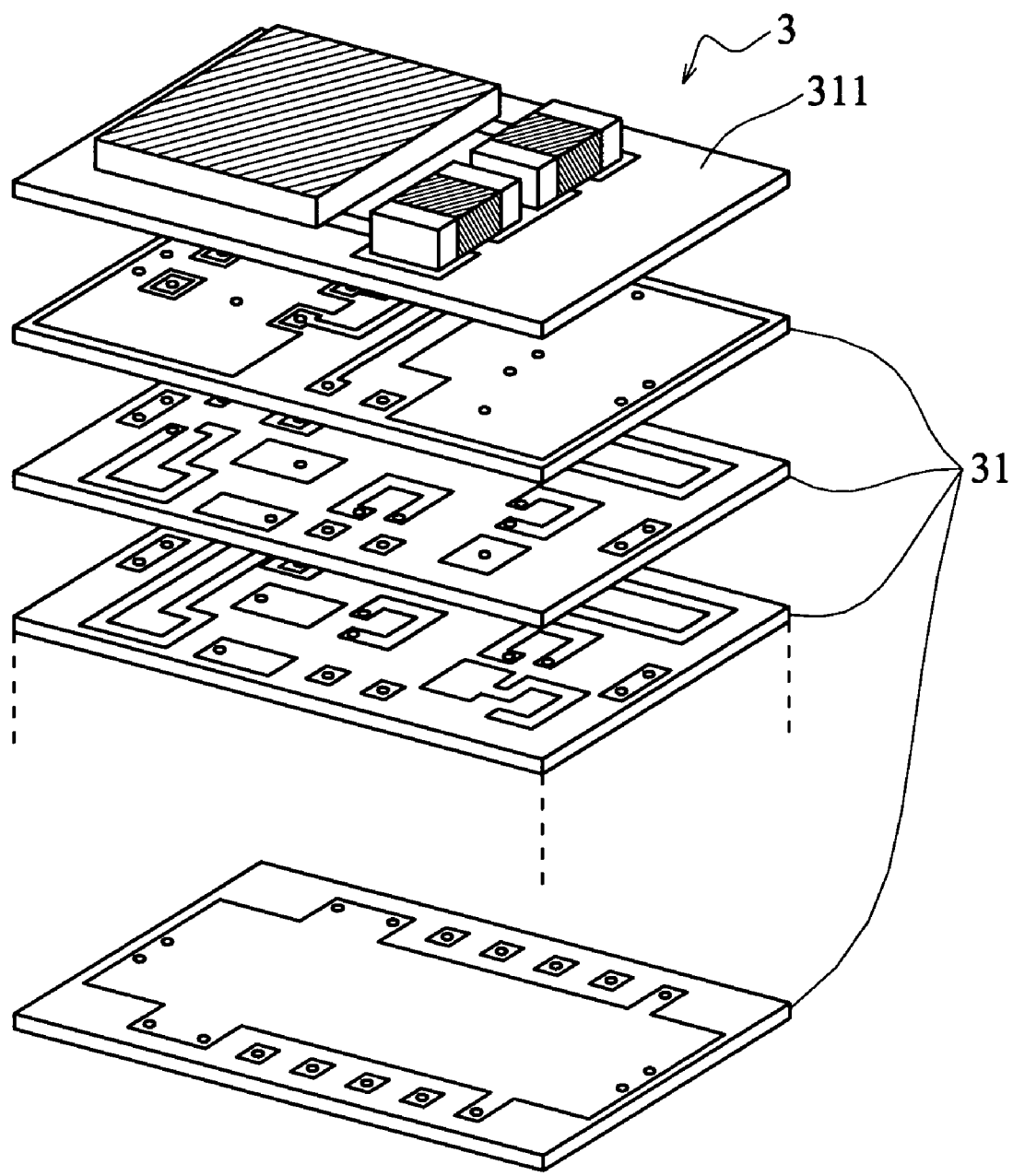
FIG. 3 is a perspective view showing the arrangement of the front-end module for multi-band and multi-mode wireless network system inside the low temperature co-fired ceramic substrate according to the invention.

Referring to FIG. 3, the front-end modules 1 and 2 for multi-band and multi-mode wireless network system all use multi layers of low temperature cofired ceramic substrate 31 to form an integrated module 3. Each low temperature cofired ceramic substrate 31 is composed of many ceramic dielectric materials and has many conductive layers therein.

To be specific, we use patterning technology to form the passive elements such as capacitors and inductances composing the elements including the diplexers 12a and 12b, the multi-plexers 22a and 22b, the band pass filters 13a, 13b, 23a, 23b, 23c . . . , the baluns 15a, 15b, 25a, 25b, 25c . . . , the low pass filters 14a, 14b, 24a, 24b, 24c . . . of the front-end module 1 and 2 for multi-mode and multi-band wireless network inside each low temperature cofired ceramic substrate 31.

In addition, we mount the GaAs switch and the subordinate passive elements such as capacitors having large diversity switches 11 and 21 and resistors, and other active elements such as IC semiconductor elements on the upmost layer of the integrated module 3, i.e. the surface layer 311, by means of surface mounting technology.

Figure 4A:
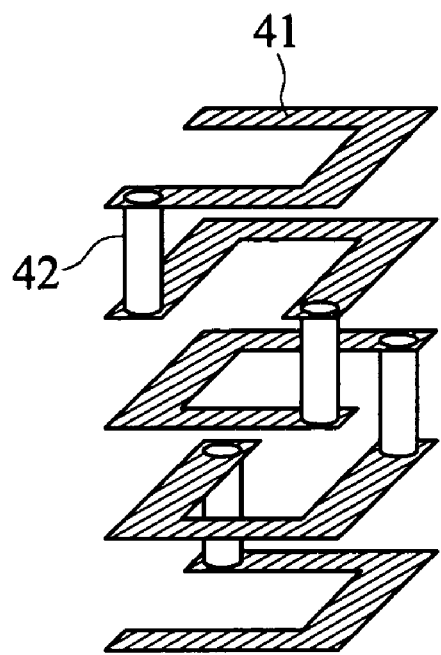
FIG. 4A is a schematic diagram showing the configuration of inductances of the front-end module for multi-band and multi-mode wireless network system inside the low temperature co-fired ceramic substrate according to the invention.
Figure 4B:
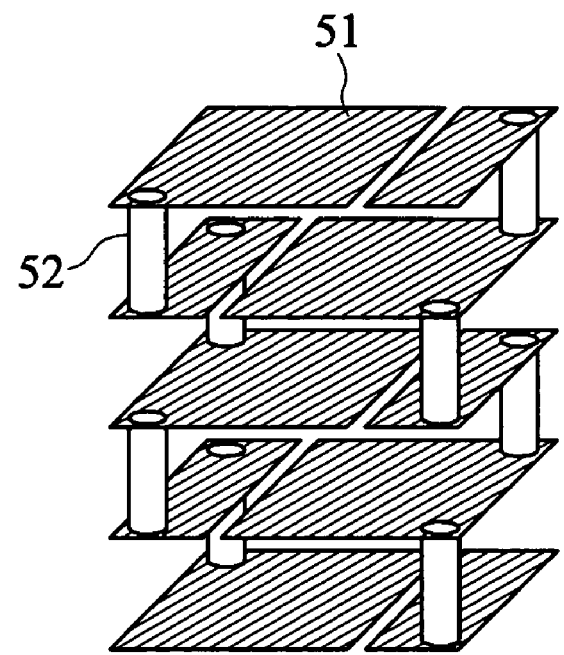
FIG. 4B is a schematic diagram showing the configuration of capacitors of the front-end module for multi-band and multi-mode wireless network system inside the low temperature co-fired ceramic substrate according to the invention.

As shown in FIG. 4A, the above-mentioned inductances are formed on the conductive layers 41 inside each of low temperature cofired ceramic substrate 31 to become strip type electrodes. Since there are electric dielectric layers (not shown) inside each conductive layer 41, and these conductive layers 41 are connected with via holes 42, the inductances inside the multiplayer low temperature cofired ceramic substrates 31 are connected in a spiral form. On the other hand, as shown in FIG. 4B, these capacitors are formed on the conductive layers 51 inside each low temperature cofired ceramic substrate 31 to become block electrodes by block patterning. There are electric dielectric layers (not shown) and via holes 52 for connection between each conductive layer 51, and therefore capacitors inside the multiplayer low temperature cofired ceramic substrate 31 are performed to be overlapped.

In addition, the LC circuit inside each layer of low temperature cofired ceramic substrate 31 under the surface layer 311 is connected to the GaAs switch and its subordinate passive elements of the diversity switches 11 and 21, and active elements such as IC via the above-mentioned via holes 42 and 52.

Since part elements of the front-end modules 1 and 2 for multi-mode and multi-band are embedded into multi-layer ceramic substrates to be integrated by patterning, the entire volume can be reduced, and the demand for multi-band and multi-mode and modularization and miniaturization can be satisfied.

While the invention has been described by way of example and in terms of the preferred embodiment, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A front-end module for multi-band and multi-mode wireless network system, connecting two antennas, comprising:
   two diplexers each comprising at least a high pass filter and a first low pass filter;
   a diversity switch connecting one of the diplexers with one of the antennas;
   two band pass filters connecting one of the diplexers;
   two baluns one-on-one connecting the band pass filters; and
   two second low pass filters connecting the other of the diplexers.

2. The front-end module set forth according to claim 1, wherein the diplexers, the band pass filters, the baluns, and the second low pass filters are formed in a plurality of low temperature cofired ceramic substrates by patterning, and the diversity switch is disposed on a surface layer of the low temperature cofired ceramic substrates.

3. The front-end module set forth according to claim 2, wherein there are a plurality of conductive layers and a plurality of dielectric layers in the low temperature cofired ceramic substrates, and there are via holes between the conductive layers.

4. The front-end module set forth according to claim 3, wherein the diplexers, the band pass filters, the baluns, and the second low pass filters each comprises a plurality of capacitor and a plurality of inductances and all are formed on the conductive layers by patterning.

5. The front-end module set forth according to claim 4, wherein the capacitors are patterned to have block configuration, and the inductances are patterned to have strip configuration.

6. The front-end module set forth according to claim 4, wherein the capacitors and the inductances are connected to the surface layer of the low temperature cofired ceramic substrates through the via holes between the conductive layers.

7. The front-end module set forth according to claim 2, the diversity switch comprises a GaAs switch and its subordinate passive elements.

8. The font-end module set forth according to claim 7, the GaAs switch and its subordinate passive elements are mounted on the surface layer of the low temperature cofired ceramic substrate by surface mounting technology.

9. The front-end module set forth according to claim 2, wherein the surface layer is provided with IC element.

10. The front-end module set forth according to claim 1, wherein each of the baluns connects two receiving terminals, and each of the second low pass filters connects one transmitting terminal.

11. A front-end module for multi-band and multi-mode wireless network system, connecting two antennas, comprising:
    two channel-separating devices each comprising at least a high pass filter and a first low pass filter;
    a diversity switch connecting one of the channel-separating devices with one of the antennas;
    a plurality of band pass filters connecting to one of the channel-separating devices with the number of the band pass filters equivalent to the number of the channels for carrying a radio frequency signal;
    a plurality of baluns one-on-one connecting to the band pass filters with the number of the baluns equivalent to the number of the channels for carrying a radio frequency signal; and
    a plurality of second low pass filters connecting to the other of the channel-separating devices with the number of the second low pass filters equivalent to the number of the channels for carrying a radio frequency signal.

12. The front-end module set forth according to claim 11, wherein the channel-separating devices are multiplexers.

13. The front-end module set forth according to claim 11, wherein the channel separating elements, the band pass filters, the baluns and the second low pass filters are formed in a plurality of low temperature cofired ceramic substrates by patterning, and the diversity switch is disposed on a surface layer of the low temperature cofired ceramic substrates.

14. The front-end module set forth according to claim 13, wherein there are a plurality of conductive layers and a plurality of dielectric layers inside the low temperature cofired ceramic substrates, and there are via holes between the conductive layers.

15. The front-end module set forth according to claim 14, wherein the channel separating devices, the band pass filters, the baluns, and the second low pass filters each comprises a plurality of capacitors and a plurality of inductances, and all are formed in the conductive layers by patterning.

16. The front-end module set forth according to claim 15, wherein the capacitors are formed to have block patterns while the inductances are formed to have stripe patterns.

17. The front-end module set forth according to claim 15, wherein the capacitors and the inductances are connected to the surface layer of the low temperature cofired ceramic substrates through the via holes between the conductive layers.

18. The front-end module set forth according to claim 13, the diversity switch comprises a GaAs switch and its subordinate passive elements.

19. The front-end module set forth according to claim 18, wherein the GaAs switch and its subordinate passive element are mounted on the surface layer of the low temperature cofired ceramic substrate by surface mounting technology.

20. The front-end module set forth according to claim 13, wherein the surface layer is provided with IC element.

21. The front-end module set forth according to claim 11, wherein each of the baluns connects two receiving terminals, and each of the second low pass filters connects one transmitting terminal.

* * * * *